(12) United States Patent
Determan

(10) Patent No.: US 6,430,220 B1
(45) Date of Patent: Aug. 6, 2002

(54) DISTORTION REDUCTION METHOD AND APPARATUS FOR LINEARIZATION OF DIGITAL PULSE WIDTH MODULATION BY EFFICIENT CALCULATION

(75) Inventor: Michael W. Determan, Brighton, MA (US)

(73) Assignee: Apogee Technology Inc., Norwood, MA (US)

( * ) Notice: Subject to any disclaimer, the term of this patent is extended or adjusted under 35 U.S.C. 154(b) by 0 days.

(21) Appl. No.: 09/665,029

(22) Filed: Sep. 19, 2000

(51) Int. Cl.[7] .......................... H03K 7/08; H04L 25/03; H03F 3/38
(52) U.S. Cl. ................... 375/238; 375/254; 375/296; 330/10; 332/109
(58) Field of Search ................... 375/238, 239, 375/243, 254, 285, 296, 297, 346, 350; 370/212; 330/10, 149; 341/70, 71, 72; 329/312; 332/109

(56) References Cited

U.S. PATENT DOCUMENTS

| | | | | |
|---|---|---|---|---|
| 5,559,467 A | * | 9/1996 | Smedley ...................... | 330/10 |
| 5,617,058 A | | 4/1997 | Adrian et al. ................. | 330/10 |
| 6,107,876 A | * | 8/2000 | O'Brien ........................ | 330/10 |
| 6,208,671 B1 | * | 3/2001 | Paulos et al. ................ | 370/545 |
| 6,240,132 B1 | * | 5/2001 | Yedid .......................... | 375/232 |
| 6,281,824 B1 | * | 8/2001 | Masuda ....................... | 341/144 |

OTHER PUBLICATIONS

Karsten Nielsen, "A Review and Comparison of Pulse Width Modulation (PWM) Methods for Analog and Digital Input Switching Power Amplifers", Bang & Olufsen, Denmark, Institute of Automation, Technical University of Denmark, Presented at the 102nd Convention, Mar. 22–25, 1997, Munich Germany, pp. 1–57.

PH Mellor, et al., "Reduction of Spectral Distortion in Class D amplifiers by an Enhanced Pulse Width Modulation Sampling Process", IEE Proceedings–G, vol. 138, No. 4, Aug. 1991, pp. 441–447.

Moj Hawdsford, "Dynamic Model–Based Linearization of Quantized Pulse–Width Modulation for Applications in Digital–to–Analog Conversion and Digital Power Amplifier Systems", J. Audio Eng. Soc., vol. 40, No. 4, Apr. 1992, pp. 235–250.

P Craven, "Toward the 24–bit DAC: Novel Noise–Shaping Topologies Incorporating Correction for the Nonlinearity in a PWM Output Stage", J. Audio Eng. Soc., vol. 41, No. 5, May 1993, pp. 291–311.

* cited by examiner

Primary Examiner—Young T. Tse
(74) Attorney, Agent, or Firm—Brian L. Michaelis; Joseph P. Quinn; Brown, Rudnick Berlack Israels LLP

(57) ABSTRACT

A system and method for reducing distortion in a pulse width modulated digital system by selectively implementing linearization. The linearization is implemented computationally efficient, using no division operations. A frequency detector is implemented which causes signals to bypass the linearization algorithm at frequencies where the new modes of distortion become significant as a result of the linearization when used in combination with an interpolation filter.

23 Claims, 10 Drawing Sheets

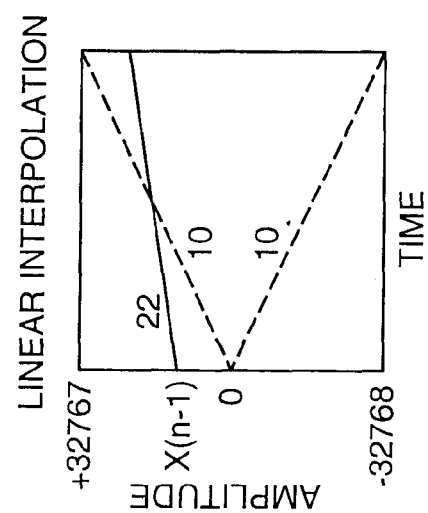
FIG. 1A
(PRIOR ART)
NATURAL SAMPLING
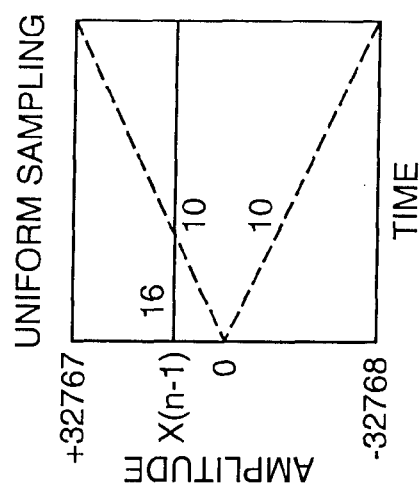
FIG. 1B
(PRIOR ART)
UNIFORM SAMPLING
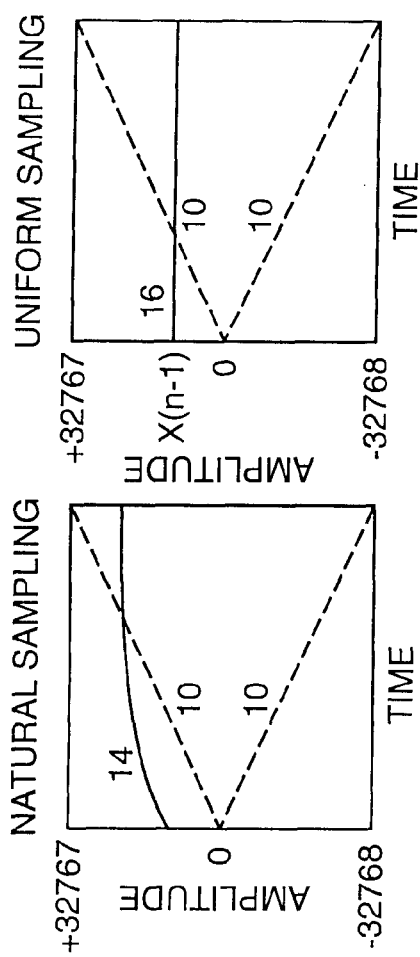
FIG. 1C
(PRIOR ART)
LINEAR INTERPOLATION
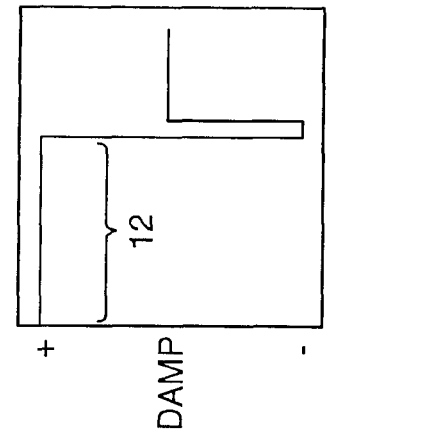
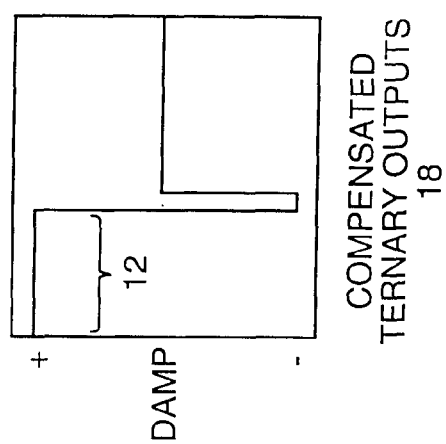
COMPENSATED TERNARY OUTPUTS
18
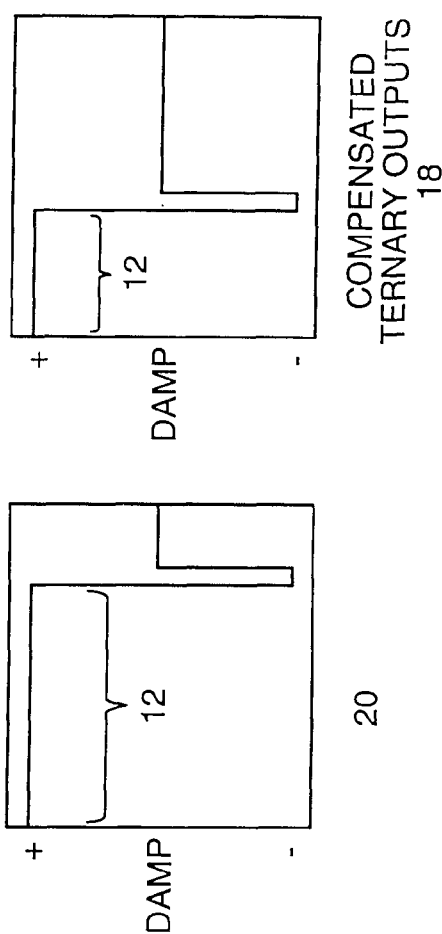

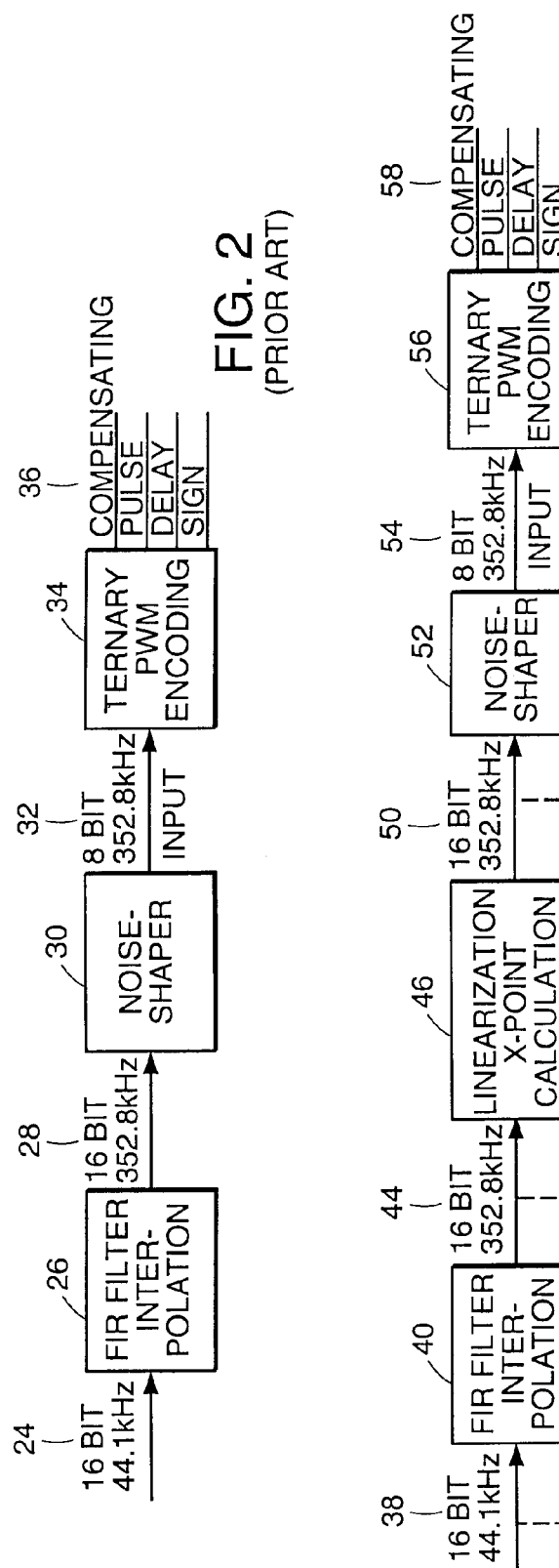
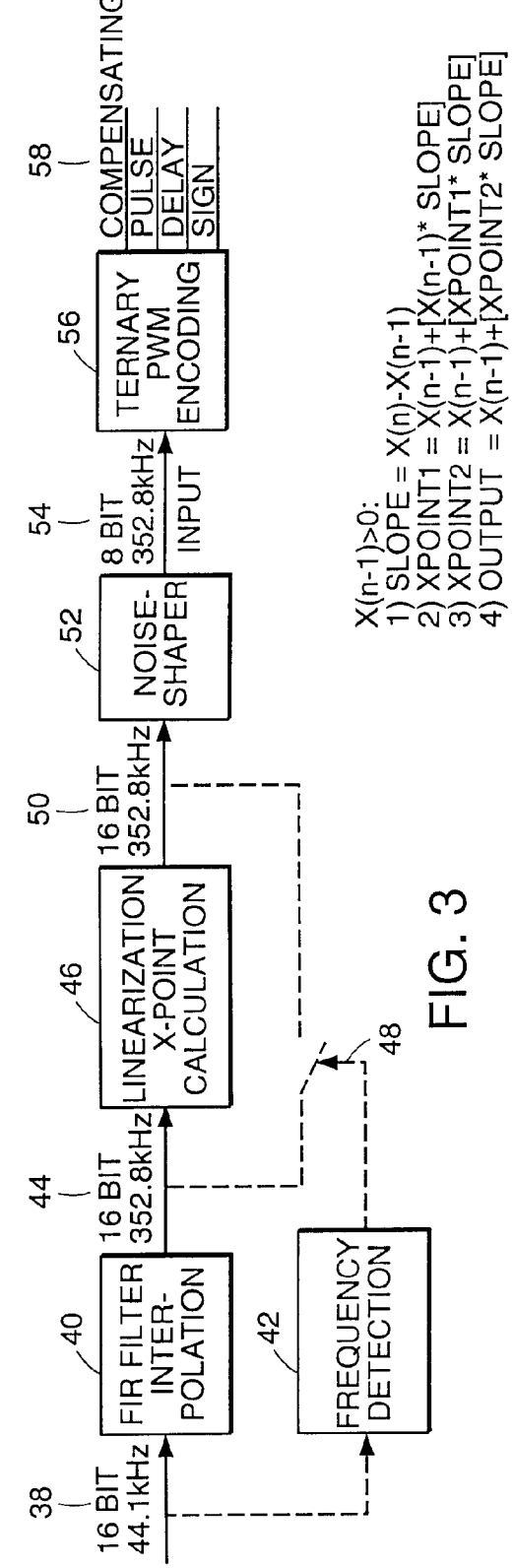

NS OUTPUT > 0:

COMPENSATING PULSE = 5
DELAY = 10
PULSE = INPUT + 5
SIGN = 0

NS OUTPUT < 0:

COMPENSATING PULSE = 5
DELAY = 0
PULSE = ABS(INPUT) + 5
SIGN = 1

1) XOFFSET(n-1) = X(n-1) + 32768
2) SLOPE = X(n) - X(n-1)
3) XPOINT1 = XOFFSET(n-1) + [XOFFSET(n-1)* SLOPE]
4) XPOINT2 = XOFFSET(n-1) + [XPOINT1* SLOPE]
5) OUTPUT = XOFFSET(n-1) + [XPOINT2* SLOPE]

DISTORTION REDUCTION METHOD AND APPARATUS FOR LINEARIZATION OF DIGITAL PULSE WIDTH MODULATION BY EFFICIENT CALCULATION

FIELD OF THE INVENTION

The present invention relates generally to digital audio amplifiers and more particularly to a method and apparatus for reducing harmonic distortion resulting from uniform pulse width modulation.

BACKGROUND OF THE INVENTION

Digital audio amplifiers typically implement one of several pulse width modulation schemes to effect audio signal modulation. In these amplifiers, uniform pulse width modulation, hereinafter UPWM, is a standard method of pulse width modulation used in some known audio amplifiers wherein the amplitude of each input sample is converted to a corresponding output pulse width. The beginning and ending points of a pulse can be defined by points of intersection between a saw-tooth modulation waveform and a quantized input signal waveform. UPWM is easily implemented but is known to produce significant detrimental harmonic distortion resulting in a nonlinear response. The frequency spectrum of each pulse varies as a function of the pulse width. This dynamic variation is the cause of undesirable harmonic distortion.

Another method of modulating audio signals known as natural pulse width modulation, hereinafter NPWM, is inherently distortion free. The beginning and ending points of a pulse are defined by points of intersection between a saw-tooth modulating waveform and an analog input waveform. However, NPWM cannot be implemented in a quantized system with digital input because it operates on an analog input signal. Various techniques are known to approximate NPWM in fully digital systems and thereby reduce harmonic distortion.

Other methods are known that emulate NPWM by using linearizing algorithms which operate on information from more than one input sample to determine each output pulse width. Such methods are often referred to as linearized pulse width modulation, hereinafter LPWM. Prior art demonstrates linear interpolation between two adjacent input samples to achieve the output pulse width. For example, Mellor, P. H. et al, "Reduction of Spectral Distortion in Class D Amplifiers by Enhanced Pulse Width Modulation Sampling Process" IEEE Proceedings-G, Vol. 138, No. 4, August 1991 pp. 441–448 teaches an enhanced sampling process wherein an analog input signal f(t) is transformed into an enhanced signal $f_n(t)$ where $f_n(t)=f((1-\epsilon)(t-nT)+nT)$ and $0 \leq \epsilon \leq 1$ before it is combined with a saw-tooth modulation wave to define output pulse widths. T is the sampling period, n is the sample index and t is the independent variable. As variable $\epsilon$ approaches 0, the interpolation approaches natural sampling. As $\epsilon$ approaches 1, the interpolation approaches uniform sampling. Other interpolation methods are known using increasing numbers of samples to define each output pulse. Such methods more closely approach natural sampling but require more complex implementation.

Other methods of distortion reduction of UPWM in the prior art provide improvements by introducing several filters to correct for non-linearity. For example, Hawksford, M. O. J., "Dynamic Model Based Linearization of Quantized Pulse Width Modulation for Applications in Digital to Analog Conversion and Digital Power Amplifier Systems" Journal of Audio Engineering Society, Vol. 40, NO. 4, April 1992, pp. 235–250 teaches a method of compensating for the frequency dependant harmonic distortion over a limited bandwidth. Multiple finite impulse response (FIR) filters are interleaved between over-sampled pulse code modulated (PCM) data and a pulse width modulator wherein frequency responses are individually matched to the inverse square of each corresponding pulse in a pulse width modulated sequence. A dynamic filtering process is thereby provided. The extra filtering components used in these methods require an undesirably large number of storage elements and calculation cycles.

Still other methods of distortion reduction in pulse width modulated systems involve much additional complexity and require significant ROM storage. For example, Craven, Peter, "Toward the 24 bit DAC: Novel Noise-Shaping Topologies incorporating Correction for the Non-linearity in a PWM Output Stage." Journal Audio Engineering Society, Vol. 41, No. 5, May 1993, pp. 291–311 teaches a complex method of nonlinear noise shaping which digitally simulates the intrinsic non-linearity of a pulse width modulation system and provides corrections through feedback and feedforward paths.

U.S. Pat. No. 5,617,058 to Adrian et al. which is incorporated herein by reference teaches implementation of techniques for ternary modulation wherein a compensating pulse is added to an output pulse to compensate the linearity of a power switch. The Adrian et al. patent also teaches signal flow for digital amplification.

All prior mentions of linear interpolation in digital pulse width modulation either do not include an algorithm to determine the pulse width, or they disadvantageously use a division operation to compute the pulse width. Division operations are extremely computationally inefficient in digital signal processing and require many more computation steps than addition or multiplication operations, for example. Additional silicon area is therefore required to implement techniques involving division. Generally known implementations do not provide computationally efficient methods to reduce harmonic distortion in pulse width modulated systems. None of the prior art methods completely eliminate harmonic distortion.

SUMMARY OF THE INVENTION

The present invention substantially reduces harmonic distortion in a pulse width modulated system by approximating natural pulse width modulation (NPWM) using a method of linear interpolation that requires only additions and multiplications of data in a manner which is computationally efficient for digital signal processing.

According to the invention, a linearization algorithm is implemented between an interpolation, such as may be performed using a finite impulse response filter, (FIR), and a noise shaper. The linearization algorithm iteratively estimates the intersection between a natural input and the modulation wave thereby significantly reducing certain harmonic distortion that is inherent in uniform pulse width modulation (UPWM).

The present invention implements a frequency detector algorithm which disables the linearization algorithm at high frequencies. The frequency detector in an exemplary embodiment consists of a state machine that selects either to implement or bypass the linearization algorithm. The frequency detection algorithm is performed once per input sample before the interpolation filter. Where ternary pulse width modulation is used, a limiting frequency is chosen at the sampling frequency divided by six because the third harmonic is the dominant distortion product of compensated ternary pulse width modulation. Where binary pulse width modulation is used, a limiting frequency is chosen at the sampling frequency divided by four because the second harmonic is the dominant distortion product for compensated binary pulse width modulation. Above these frequencies, the dominant distortion product will be above the audio frequency band.

The output of the linearization algorithm in the illustrative embodiment is input to the noise-shaper, which reduces the number of bits and thereby allows the PWM output clocking to run at an attainable speed. The noise shaper output is then encoded into ternary PWM timing information. The ternary PWM output comprises three states: positive, negative and damped. Each of these states is entered every PWM cycle. The values generated for the output timer are, compensation, pulse, delay and sign. These values are loaded into the counter and determine the length of time the output remains in each state for each PWM cycle. For binary pulse width modulation, the output of the noise shaper indicates the sole pulse value. The application of the linearization algorithm practically necessitates the use of single-sided modulation because using double sided modulation with linearized pulse width modulation severely increases the complexity of the noise shaper. A standard noise shaper, known in prior art, may be used in conjunction with single sided modulation.

Linearized pulse width modulation (LPWM) can also be applied to binary modulation. Binary modulation comprises only two output states: positive and negative. The net pulse output is the difference between the time spent in each state per pulse period. All of the benefits of the present invention may be applied to binary pulse width modulation systems by implementing an alternative embodiment having a modified linearization algorithm.

It has been determined that the combined use of interpolation and linearized pulse width modulation introduces certain additional distortion that has not been discussed in the prior art. It has long been known that the over-sampled signal output from the interpolation filter contains spectral images replicated around multiples of the original sampling frequency. These images are attenuated by the interpolation filter. Because Nyquist theorem is obeyed in the encoding of the digital signal, these images never reach back into the audio spectrum and therefore do not cause audible distortion. However, where a linearization algorithm is applied to data post interpolation filter, it has been found that compensation products of the linearization algorithm can intermodulate with the replicated spectral images of the FIR filter and, at high frequencies, cause distortion to appear back in the audio spectrum.

Pulse width modulation encoding of a signal is also known to produce distortion products. However these known distortion products do not intermodulate with replicated spectral images because conversion to pulse width modulation does not follow Nyquist's theory. The significant distortion products caused by pulse width modulation are out of band at high frequencies so any benefit gained by application of linearization processing at high frequencies may be outweighed by detrimental intermodulation distortion.

Features of the present invention include a method of significantly reducing the harmonic distortion that is typically associated with uniform pulse width modulation (UPWM). As an additional feature, the present invention is implemented on a quantized digital system, unachievable in natural pulse width modulation (NPWM) systems. The present invention also includes the benefits of linearized pulse width modulation (LPWM) using a significantly simplified implementation. The implementation according to the invention features an algorithm which does not require division operations and therefore advantageously requires fewer storage elements and computation cycles than other distortion reduction methods. By requiring fewer storage elements and computation cycles, the invention facilitates fast operation and minimum physical space on an integrated circuit. As a result, the invention features a low cost, highly efficient method of reducing harmonic distortion in a digital pulse width modulated system.

Certain implementations of the present invention provide additional advantages of having a lower noise floor and lower distortion for damped ternary modulation at high amplitudes when a compensation pulse is not used.

BRIEF DESCRIPTION OF THE DRAWINGS

These and other features of the present invention will be better understood when reading the following description taken together with the accompanying drawings FIGS. 1A, 1B and 1C represent respectively an example of single pulse cycle of compensated ternary outputs for a natural uniform pulse width modulated system (NPWM), a uniformly sampled pulse width modulated system (UPWM) and a linearly interpolated pulse width modulated system (LPWM) as are known in the prior art.

FIG. 2 represents a block diagram of an exemplary ternary pulse width modulated system as known in the prior art.

FIG. 3 illustrates a block diagram of an exemplary embodiment of a linearized pulse width modulated system having frequency detection according to the present invention.

FIG. 4 is a listing of steps of a linear interpolation algorithm according to at least one embodiment of the present invention.

DETAILED DESCRIPTION

Figure 5:
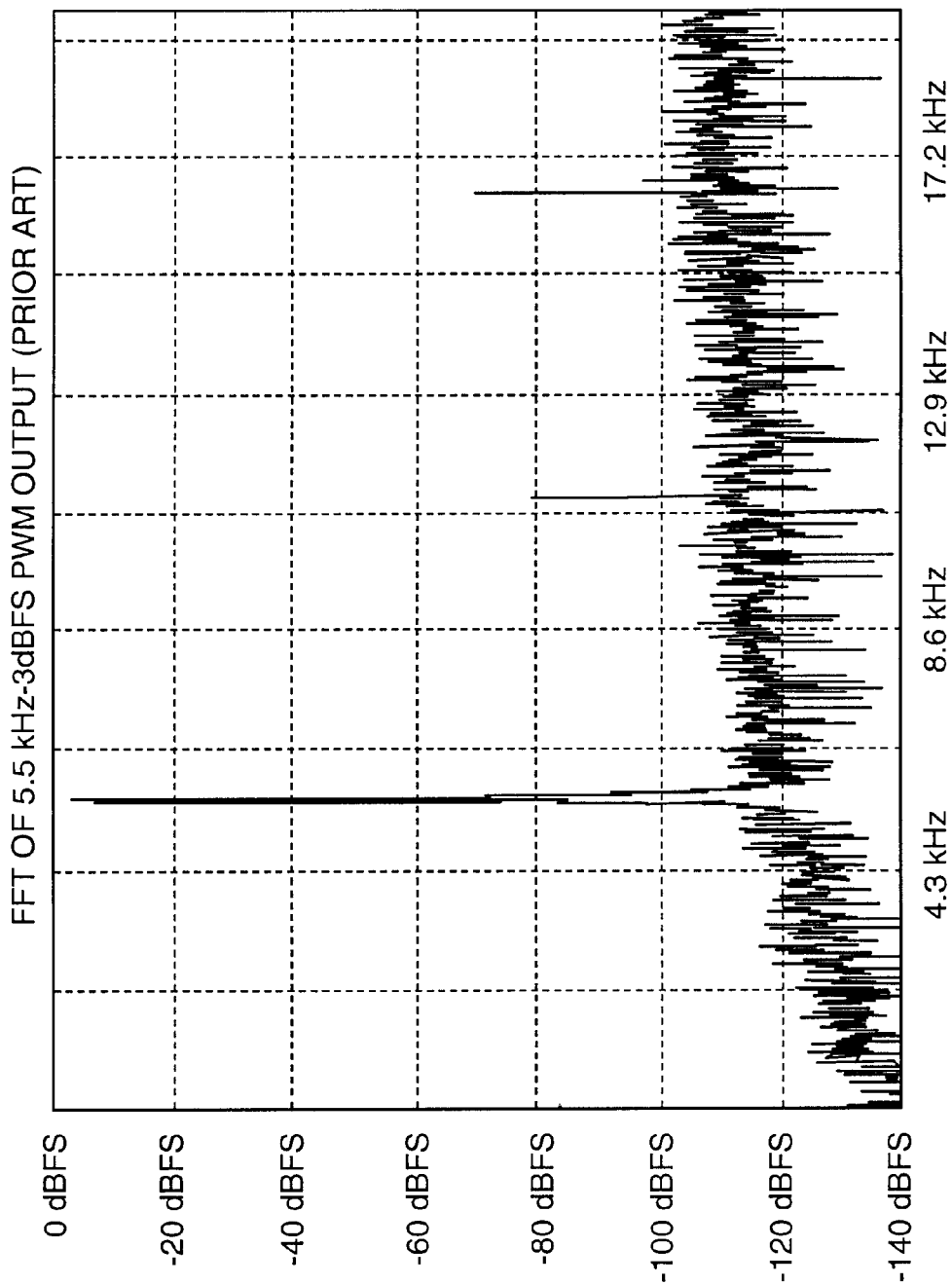
FIG. 5 is a graph of the frequency spectrum of the output of a compensated pulse width modulation system according to the prior art.

Illustrative embodiments of the apparatus and methods disclosed herein are discussed in terms of digital audio amplifiers. It is envisioned, however that the invention disclosed herein is applicable to a wide variety of digital systems that require reduction of harmonic distortion such as any digital pulse width modulated system or the like. It should be recognized by persons skilled in the art that the term "digital audio amplifier" is a generic term for Class D switching amplifier and that both digital and analog versions of Class D amplifiers exist.

Referring first to FIGS. 1A–1C, three types of pulse width modulation known in the prior art are graphically illustrated. A graph of compensated ternary output is disposed below a graph of an input signal superimposed on a modulation signal for a naturally sampled, uniform sampled and linearly interpolated input signal in FIG. 1A, 1B and 1C respectively. These time domain representations are illustrative of the differences between each type of pulse width modulation. For example, as in FIG. 1A, in a natural sampling system an analog input curve intersects a modulation wave to determine the length of a pulse in each frame. The analog input signal of the illustration is the concave-down curve in the top frame of FIG 1A.

A dual single sided modulation signal 10 is illustrated in each of the top frames of FIGS. 1A–1C by the pair of straight lines sloping upward and downward from a zero amplitude level. A pulse width 12 representing a sample of the amplitude of the analog signal is easily constructed by maintaining a pulse of a given state during each frame until the natural analog input signal 14 intersects the modulation wave. The compensated ternary outputs shown include a compensating pulse as described in the prior art, for example in U.S. Pat. No. 5,617,058 to Adrian et al. which is incorporated herein by reference. It can be seen that a ternary pulse width modulation output can include three states: positive, negative and damp. Harmonic distortion is not illustrated in FIGS. 1A–1C because the signal is depicted in the time domain, however it is well known in the art that natural pulse width modulation is free from harmonic distortion. It is also well known that truly natural sampling can not be realized in a digital system because a digital system must quantize the analog signal thereby introducing some harmonic distortion.

A frame illustrating uniform sampling of the same signal is provided in FIG. 1B. A sample 16 is taken at the beginning of the frame and held constant at an amplitude x(n−1) until it intersects the modulation wave. It can be seen that uniform sampling is well suited for digital systems because it requires no additional quantization steps. However by comparing the compensated ternary output 18 of the uniformly sampled input 16 with the compensated ternary output 20 of the naturally sampled input 14 it can be seen in the time domain that the pulse width 12 can be quite different depending on the type of sampling. Natural sampling provides the most accurate output. Such differences in the time domain appear in the frequency domain as harmonic distortion.

Linear interpolation of an input signal is known as a method of distortion reduction to approximate natural sampling as an alternative to more densely sampling an analog input. An interpolated input level is determined by taking information from more than one sample of an input signal per output frame. For example, by taking a sample of the input signal at the beginning and the end of a frame and constructing a straight line 22 between samples, an intersection of the straight line and the modulation wave provides an interpolated cross-over point from which to determine an output pulse width. A linearly interpolated input signal is illustrated in the top frame of FIG. 1C. It should be noted by reference to the output frames of FIGS. 1A–1C that the linearly interpolated input sample 22 renders an output pulse width 12 more nearly approximating the output pulse width 12 of a naturally sampled input signal 14.

Referring to FIG. 2, a block diagram of pulse with modulated audio amplifier of the prior art is depicted. The block diagram represents a system such as the system disclosed in U.S. Pat. No. 5,617,058 to Adrian et al. which linearizes a power switch by providing a ternary pulse width modulated output having a compensation component. The input signal 24 is first processed by a finite impulse response (FIR) filter 26 whereby the exemplary 16 bit, 44.1 kHz signal 24 is eight times oversampled to produce a 16 bit 352.8 kHz signal 28. The noise shaper 30 reduces quantization errors in the audio band by shifting them outside of the audio bandwidth and converts the 16 bit, 352.8 kHz signal into an 8 bit, 352.8 kHz signal 32. A Ternary PWM Encoder 34 converts the output 8 bit, 352.8 kHz signal 32 of the noise shaper 30 into timing values for a ternary pulse width modulated output signal 36.

FIG. 3 illustrates a block diagram of a ternary pulse width modulating audio amplifier according to the present invention having an additional feature of a linearization crossover point block 46 (algorithm) which can be switched out of the system by a frequency detection block 42. A 16 bit, 44.1 kHz input signal 38 is routed in parallel to an FIR interpolation filter 40 and a frequency detection block 42. The FIR interpolation filter 40 oversamples the input signal 38 to produce a 16 bit, 352.8 kHz signal. The frequency detection block 42 substantially simultaneously processes the input signal 38 to determine whether to implement or bypass a linearization cross point algorithm 46. The frequency detection block 42 controls a bypass circuit 48 to route the FIR interpolation filter output signal 44 into the linearization cross point algorithm 46 if the frequency detection block 42 determines that the input signal 38 is within a range wherein the linearization cross point algorithm 46 would reduce audio frequency distortion. Otherwise, the frequency detection block 42 causes the FIR filter output signal 44 to bypass the linearization cross point algorithm 46 by routing it directly into a noise shaper 52. If the FIR filter output signal 44 is routed through the linearization cross point algorithm 46 the output of the linearization cross point algorithm 50 is provided as input to the noise shaper 52. The noise shaper 52 reduces quantization errors in the audio band by shifting them outside of the audio frequency band and converts the 16 bit, 352.8 kHz signal into an 8 bit, 352.8 kHz signal. A Ternary PWM Encoder 56 converts the output of the noise shaper 54 into timing values for a ternary pulse width modulated output signal 58.

When implemented, the linearization algorithm provides a highly accurate interpolation of a cross-over point from which to construct a compensated ternary output pulse width. As hereinafter explained in detail the linearization algorithm may be disabled at certain frequencies where it introduces undesirable harmonic noise. The enabling/disabling of the linearization block is performed by the frequency detection block.

FIG. 4 lists the steps of an illustrative linearization block according to at least one embodiment of the present invention. The algorithm subtracts a previous input sample value from the current input sample value to obtain a slope value. The slope is represented as a fraction wherein a slope of unity value is equivalent to a per/sample change equal to a full scale digital signal. The slope is then multiplied by the preceding input sample and added to its value if the preceding input value is positive or subtracted if the preceding input value is negative. This first iteration produces a first approximation of an intersection between a natural input and a modulation wave. The output of the first iteration is multiplied again by the slope and again added to (or subtracted from) the previous input value to provide a second approximation of an intersection between a natural input and a modulation wave. The output of the second iteration is multiplied again by the slope and again added to (or subtracted from) the previous input value to provide a third approximation of an intersection between a natural input and a modulation wave. While more iterations are possible, simulations have shown that little improvement is achieved beyond three iterations of the linearization algorithm.

Figure 6:
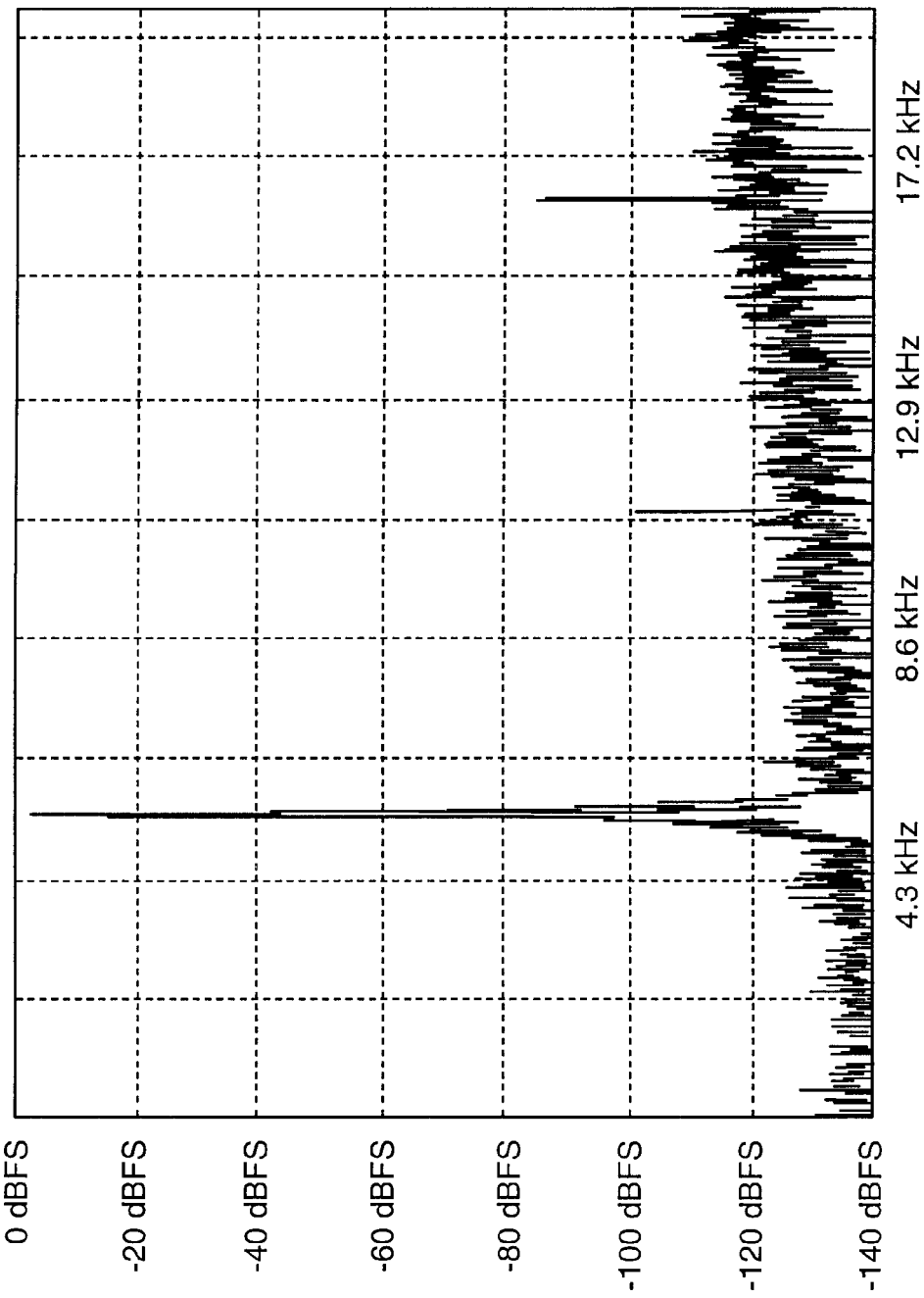
FIG. 6 is a graph of the frequency spectrum of the output of a pulse width modulated system according to at least one embodiment of the present invention.

The level of distortion is greatly reduced over the previously known algorithm as described in the Adrian et al. patent as can be seen by reference to FIGS. 5 and 6. FIG. 5 shows an FFT (Fast Fourier Transform) of a pulse width modulated output signal according to the prior art where the input signal is a 5.5 kHz signal at 44.1 kHz sampling frequency, 8 times over-sampled and 7 bit time quantization per output period, the input signal being 3 dB below the full digital modulation level (−3 dBFS). FIG. 6 shows an FFT of a pulse width modulated output signal according to an illustrative embodiment of the present invention having the same signal parameters for comparison. The total harmonic distortion percentages were determined from simulation by standard RSS (root sum of squares) summing non-fundamental harmonic components. The total harmonic distortion component of the exemplary embodiment of the present invention illustrated in FIG. 6 was determined to be 0.0089%. The total harmonic distortion component of the prior art example illustrated in FIG. 5 was determined to be 0.068%. This example demonstrates an improvement of 7.64 times or 17.66 dB less distortion than the prior art. It is also apparent that the noise floor has been reduced over the prior art thereby producing better signal to noise measurements.

Figure 7:
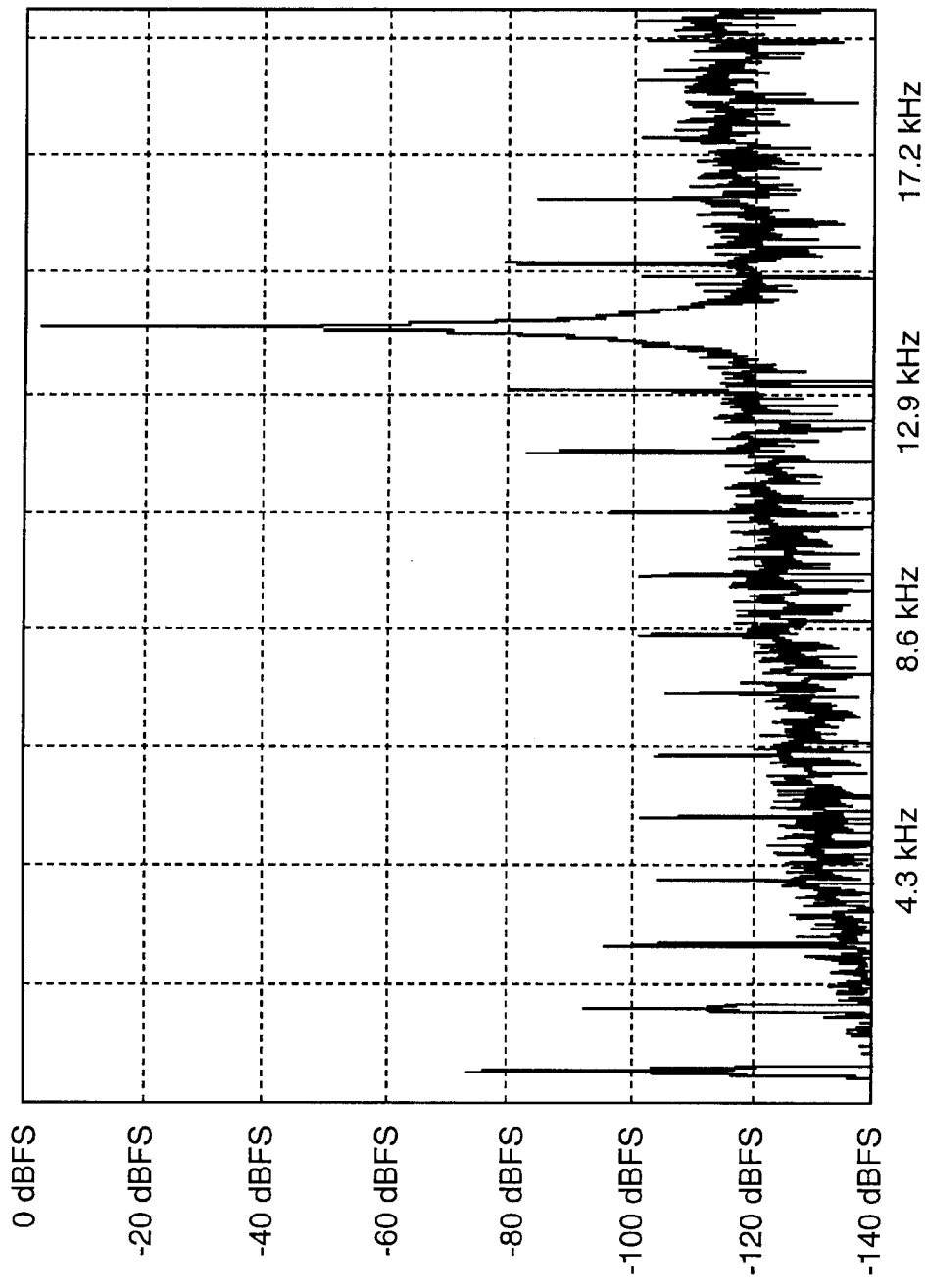
FIG. 7 is a graph of the frequency spectrum of a pulse width modulation system having an FIR interpolation filter and a linearization algorithm illustrating harmonic distortion at least partially caused by intermodulation.
Figure 8:
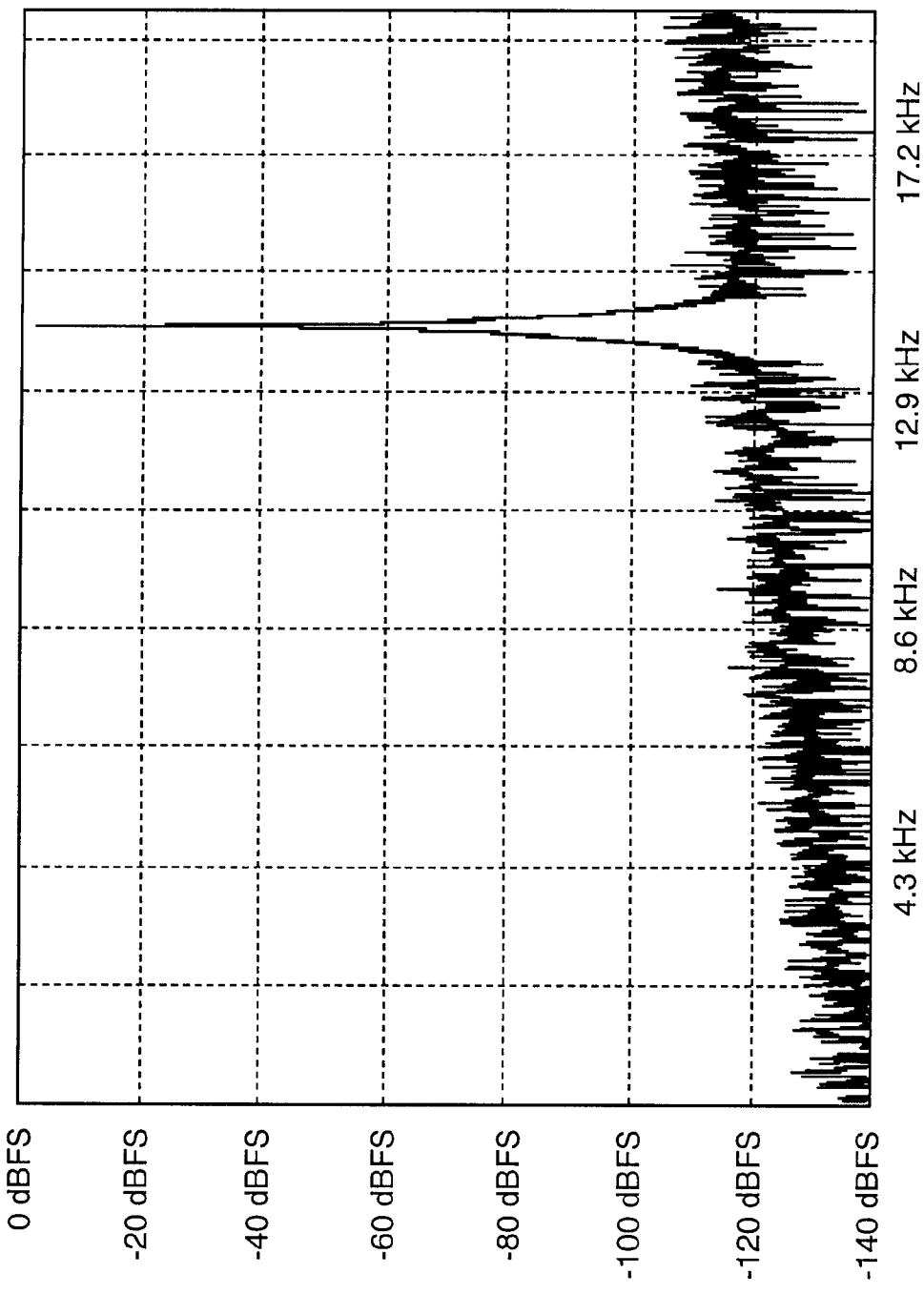
FIG. 8 is a graph of the frequency spectrum of a pulse width modulation system having an FIR interpolation filter and no implementation of a linearization algorithm illustrating an absence of intermodulation distortion.

A heretofore unknown form of distortion is encountered as a result of following an interpolation filter with a linearization algorithm. This new form of distortion is only detrimental to audio applications at high frequencies. FIG. 7 illustrates the combined effect of an FIR interpolation filter and a linearization algorithm wherein the total harmonic distortion percentage is approximately 0.9%. FIG. 8 illustrates the output of an otherwise identical system having practically no distortion wherein the linearization algorithm is disabled. The distortion has been determined to be a result of intermodulation products of the outputs of the FIR filter and the linearization algorithm. These intermodulation products appear in the audio band at high frequencies and may substantially outweighing any benefit of implementing a linearization algorithm at those frequencies. It has therefore been determined that a component of an implementation of the present invention is a frequency detector which disables the linearization algorithm at frequencies where intermodulation distortion becomes significantly detrimental.

Figures 9, 10:
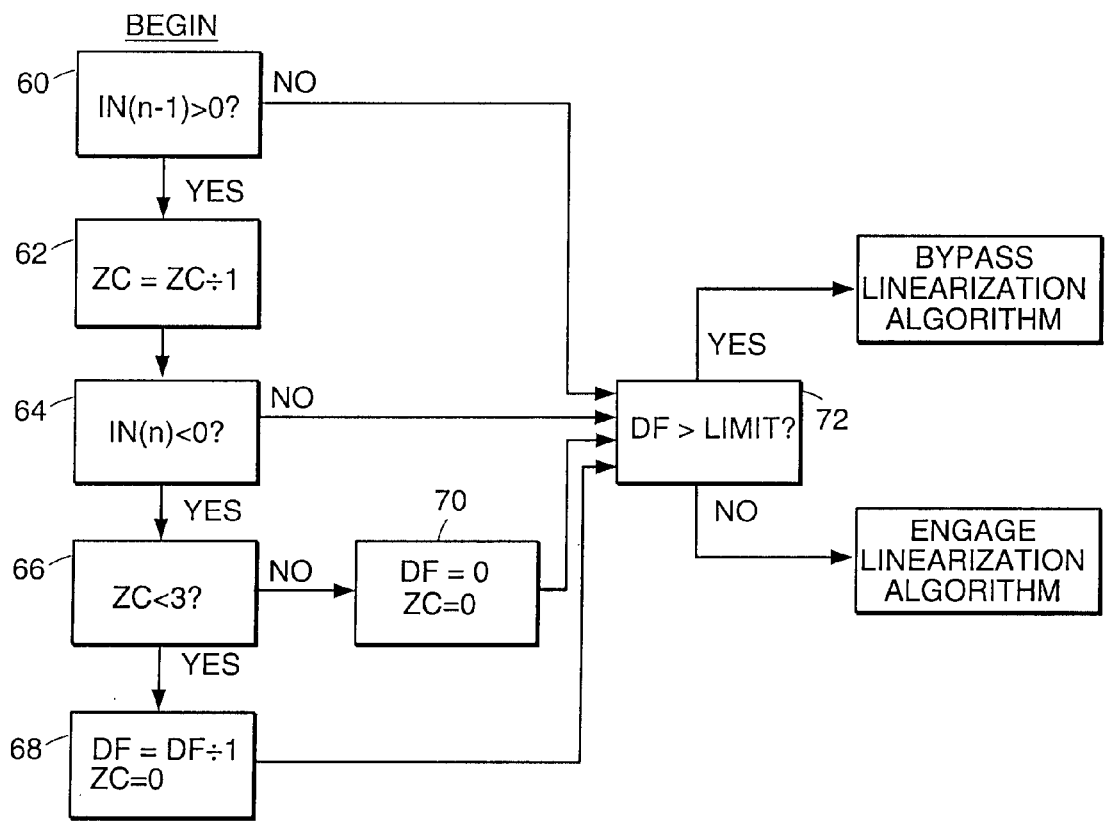
FIG. 9 represents a block diagram of a frequency detection algorithm component according to at least one embodiment of the present invention.
FIG. 10 is a listing of output timing parameters according to at least one embodiment of the present invention.

FIG. 9 illustrates a block diagram of a frequency detector according to at least one embodiment of the present invention. The frequency detector in the exemplary embodiment consists of a state machine incorporating two counters that select either to bypass or not to bypass the linearization algorithm. The frequency detector algorithm is invoked once per input sample before the FIR interpolation filter with DF and ZC standing as generic variables and where DF is initialized at zero. A first algorithm step 60 first determines whether the previous input sample was positive or negative. If the previous input sample was negative then the algorithm determines 72 whether the DF value is above a defined limit, wherein the limit determines the length of time during which the input must be above the frequency limit before the linearization algorithm is disabled. If the previous input sample is above zero then the algorithm increments 62 ZC. Once the ZC variable has been incremented, the algorithm checks 64 the current input sample value to see if it is positive or negative. If the current input sample is positive, the next step of the algorithm compares 72 the DF value to the limit value above which the linearization algorithm is disabled. If the current input sample value is negative, the algorithm checks 66 the ZC variable to see if it is less than three. If ZC is less than three then it is determined that the input frequency is above the sampling frequency divided by six. The threshold of one sixth of the sampling frequency was chosen for compensated ternary pulse width modulation systems because such systems have a third harmonic comprising a dominant distortion product. Binary pulse width modulated systems produce a second harmonic distortion product so a threshold of one fourth of the sampling frequency is used. At frequencies higher than the threshold frequency, the dominant distortion product in the digital pulse width modulation method will be above the audio frequency band. If that is the case, the algorithm then increments 68 DF if ZC<3 and resets ZC to zero awaiting the next frequency check. If ZC is greater than three, the input frequency is determined to be low enough such that distortions caused by the linearization algorithm, are not present and the inclusion of this algorithm produces the more desirable output. The ZC variable determines the frequency via zero-crossing detection with the frequency detected being equivalent to fs/2ZC. Therefore, the algorithm resets 70 DF to zero, such that the linearization algorithm will be engaged. The algorithm also resets 70 ZC to zero awaiting the next frequency check. The frequency detection algorithm is implemented in an integrated circuit using very few resources and therefore does not undermine the computational efficiency for the process of LPWM.

The output of the linearization algorithm is provided to the input of a noise shaper as is known in the prior art, for example as taught by the Adrian et al. patent. The output of the noise shaper for an exemplary ternary pulse width modulated system determines timing values which are loaded to a counter to construct a compensated ternary waveform.

Figure 11:
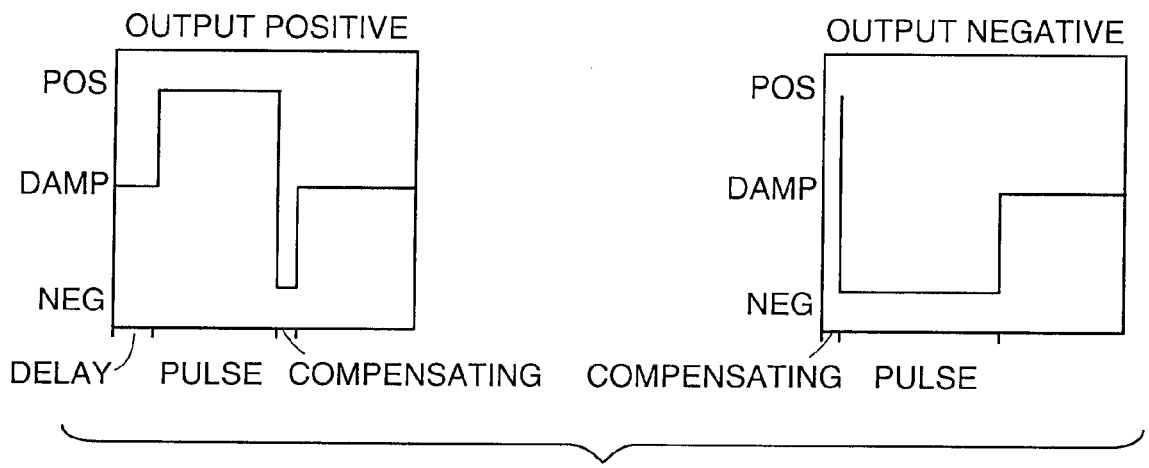
FIG. 11 is graphs of compensated output pulses according to at least one embodiment of the present invention.
Figure 12:
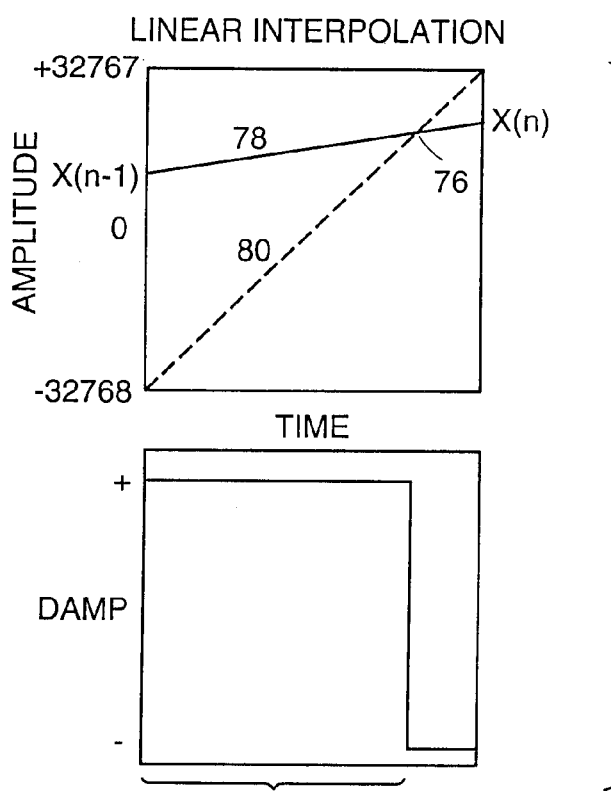
FIG. 12 represents graphs of one pulse cycle of a binary linearized pulse width modulation system according to at least one embodiment of the present invention.

FIG. 10 illustrates a list of output timing variables defining a pair of compensated pulse width modulated waveform. The corresponding waveforms are shown in FIG 11. Alternative embodiments of the present invention are applicable to binary pulse width modulated systems. As illustrated in FIG. 12, a time domain graph of a single frame of a binary pulse width modulated output signal is disposed below a depiction of linearly interpolated input superimposed on a modulation signal. It can be seen that the output pulse width 74 is defined by the cross-over point 76 where the linearly interpolated signal 78 intersects the modulation signal 80.

Figure 13:
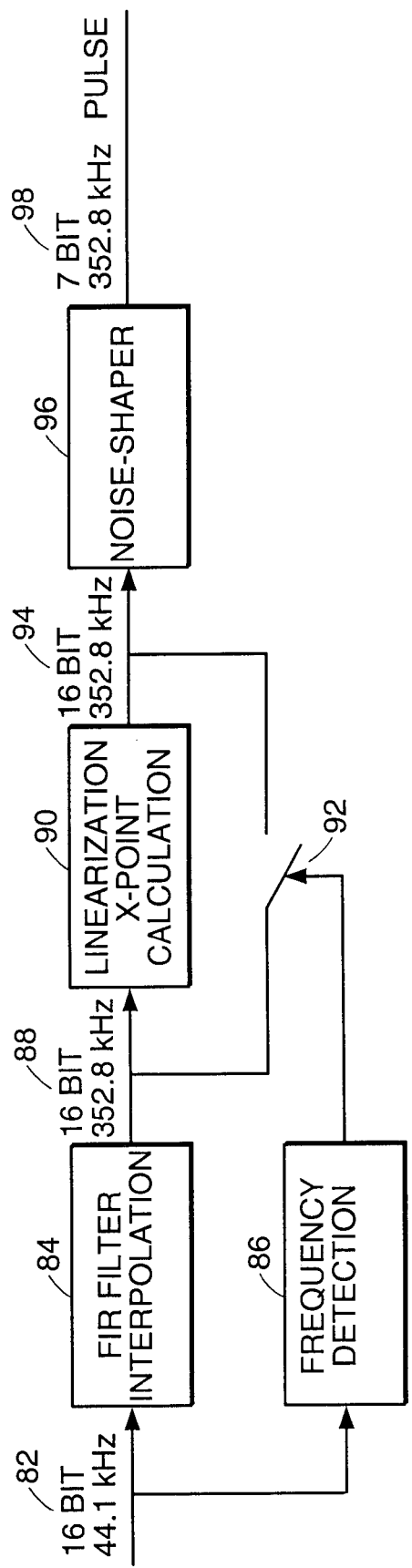
FIG. 13 is a block diagram of a binary linearized pulse width modulated system according to at least one embodiment of the present invention.

FIG. 13 is a block diagram of a binary embodiment of the present invention. The binary embodiment as illustrated in FIG. 13 is substantially similar to the ternary embodiment illustrated in FIG. 2 except wherein the binary embodiment omits a ternary PWM encoding block at the output end. Referring to FIG. 13, a 16 bit, 44.1 kHz input signal 82 is routed in parallel to an FIR filter 84 and a frequency detection block 86. The FIR filter 84 oversamples the input signal 82 to produce a 16 bit, 352.8 kHz signal 88. The frequency detection block 86 controls a bypass circuit 92 to route the FIR filter output signal 88 into the linearization cross point algorithm 90 if the frequency detection block 86 determines that the input signal 82 is within a range wherein the linearization cross point algorithm 90 would reduce audio frequency distortion. Otherwise, the frequency detection block 86 causes the FIR filter output signal 88 to bypass the linearization cross point algorithm 90 by routing it directly into a noise shaper 96. If the FIR filter output signal 88 is routed through the linearization cross point algorithm 90, the output of the linearization cross point algorithm 94 is provided as an input to the noise shaper 96. The noise shaper 96 reduces quantization errors in the audio band by shifting them outside of the audio frequency band and converting the 16 bit, 352.8 kHz signal into a 7 bit, 352.8 binary pulse 98.

Figures 14, 15:
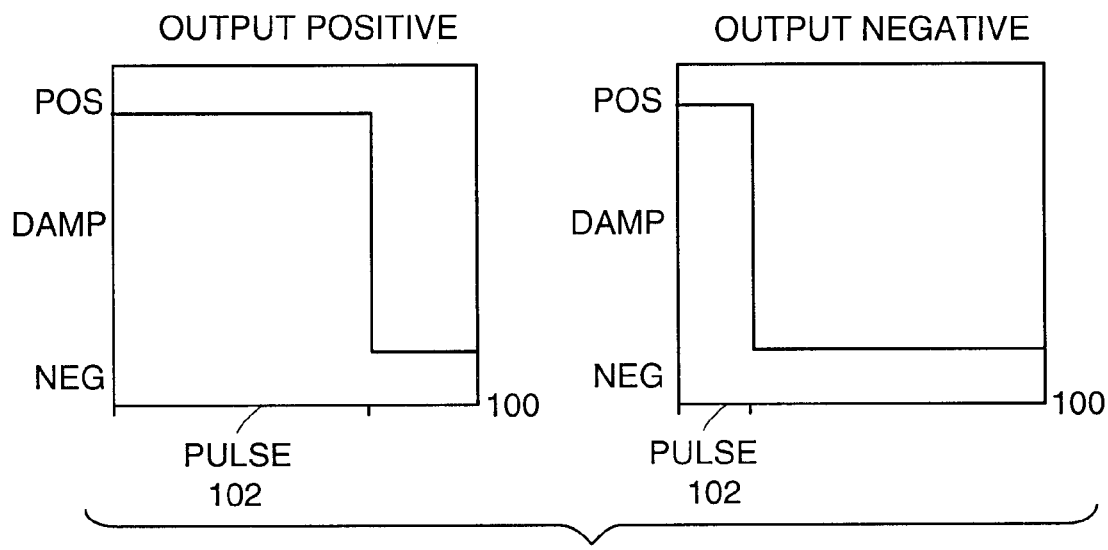
FIG. 14 is a listing of a linearization algorithm applicable to a binary pulse width modulated system according to at least one embodiment of the present invention.
FIG. 15 is graphs of binary output pulses according to at least one embodiment of the present invention.

FIG. 14 is a listing of a linearization algorithm for binary pulse width modulated systems according to the present invention. It can be seen that the linearization algorithm for binary pulse width modulation is different from the previously discussed linearization algorithm for ternary pulse width modulation. Here, the previous sample input is first offset such that all inputs are positive for a 16 bit system, with the minimum input being zero. The previous sample is then subtracted from the current sample to obtain the "slope" value. The iterative algorithm is then performed with the offset value to obtain the output. The output of linearization algorithm is then used as the input for the noise shaper.

The frequency detection algorithm of the binary embodiment is the same as the frequency detection algorithm of the ternary embodiment. The ZC value determines a cutoff of fs/[2(ZC−1)]. A ZC value of 3 will create a frequency cutoff of fs/4, which is sufficient for both ternary and binary modulation.

Output binary PWM waveforms for both positive and negative outputs are shown in FIG. 15. The sole count value, pulse 102, is shown on the time axis 100. This count value determines the time at which the transition from positive to negative states in the output device occurs.

The present invention comprises a pulse width modulated digital system having an FIR interpolation filter with a pulse code modulated digital input and a linearization block in switchable communication with the FIR interpolation filter so that the linearization block can be bypassed at frequencies where the linearization block may actually cause distortion as previously stated. Interpolation filters are well known and any number of filter types and combinations may be used without departing from the spirit and scope of the invention.

The linearization block performs a linearization algorithm as particularly described herein in terms of an illustrative embodiment. However, variations to the linearization algorithm described herein may be made without departing from the spirit and scope of the invention. For example, the steps of multiplication and addition are repeated three times in the illustrative embodiment. It should be noted that any number of iterations of the multiplication and division steps may be performed within the scope of the present invention.

The illustrative embodiment of the invention implements a frequency detector block in communication with the input to the FIR filter which is capable of causing the output of the FIR filter to bypass the linearization block when the pulse code modulated input signal exceeds a specified frequency or alternatively, to direct the output of the FIR filter to the linearization block when the pulse code modulated digital input signal does not exceed the specified frequencies. Although a particular frequency detection algorithm is described herein in terms of an illustrative embodiment, it should be appreciated by persons skilled in the art that any number of frequency detector methods and apparatus may be used. The frequency detector block may similarly use any type or number of switching circuits to route the signal to from the FIR filter to the linearization block or alternatively to bypass the linearization block. Although the illustrative embodiment implements a frequency detector block, it should be recognized that certain other embodiments of the invention may not require a frequency detector block, for example, where a system is not expected to operate at frequencies at which the linearization cross point algorithm may cause distortion.

The embodiments according to the invention also include a noise shaper in switchable communication with the linearization block wherein an output of the linearization block is input to the noise shaper. Alternatively, when the linearization block is bypassed, the output from the FIR interpolation filter is input to the noise shaper. The noise shaper is capable of providing parameters for constructing a pulse width modulated output signal. Although a particular noise shaper is described herein in terms of an illustrative embodiment, it should be noted that any number of variations may be made to the noise shaper without departing from the spirit and scope of the present invention.

Although embodiment(s) according to the present invention incorporate blocks or functional components implemented as code (i.e., software) running on a digital signal processor (DSP) it should be appreciated that components of an implementation according to the invention can be implemented with general purpose digital signal processing hardware, specially programmed computing hardware, application specific integrated circuitry, software or firmware running on general purpose or application specific hardware or various combinations of the foregoing.

While the embodiment described herein results in illustrative output timing variables, e.g. as illustrated in FIGS. 10 and 11, it should be appreciated that such outputs will be different as a function of the application, e.g. for different classes of output devices used according to the invention.

Although the invention is described hereinbefore with respect to illustrative embodiments thereof, it will be appreciated that the foregoing and various other changes omissions and additions in the form and detail thereof may be made without departing from the spirit and scope of the invention.

What is claimed is:

1. An apparatus for reducing harmonic distortion in a pulse width modulated digital system comprising:
   an interpolation filter having a pulse code modulated digital input;
   a linearization component in switchable communication with said interpolation filter, wherein an interpolation output signal of said interpolation filter is switchable to either be input to said linearization component or bypass said linearization component; and
   a noise shaper in switchable communication with said linearization component wherein an output of said linearization component is input to said noise shaper, or when said linearization component is bypassed said output from said interpolation filter is input to said noise shaper, and said noise shaper providing parameters for constructing a pulse width modulated output signal.

2. The apparatus according to claim 1 wherein said pulse width modulated digital system is a ternary pulse width modulated digital system, and
wherein said linearization component, implements linearization of data by:
subtracting a previous input sample value from a current input sample value to obtain a fractional slope value, said fractional slope value being proportional to a unity slope wherein said unity slope equals a full scale digital signal change per sample;
multiplying said fractional slope value by said previous input sample value to obtain a first partial result;
adding said previous input sample value to said first partial result to obtain a first cross point estimate if said previous input sample value is positive, or subtracting said first partial result from said previous input sample value to obtain a first cross point estimate if said previous input sample value is negative;
multiplying said fractional slope value by said first cross point estimate to obtain a second partial result;
adding said previous input sample value to said second partial result to obtain a second cross point estimate if said previous input sample value is positive, or subtracting said second partial result from said previous input sample value to obtain a second cross point estimate if said previous input sample value is negative;
multiplying said fractional slope value by said second cross point estimate to obtain a third partial result;
adding said previous input sample value to said third partial result to obtain a third cross point estimate if said previous input sample value is positive, or subtracting said third partial result from said previous input sample value to obtain a third cross point estimate if said previous input sample value is negative;
providing said third cross point estimate as an output from said linearization component.

3. The apparatus of claim 1 further comprising:
a frequency detector having an input in communication with said input of said interpolation filter, said pulse code modulated digital input to said interpolation filter also being provided to said input of said frequency detector, wherein said frequency detector selectably directs said output of said interpolation filter to bypass said linearization component when said pulse code modulated digital input exceeds a specified frequency or directs said output of said interpolation filter to said linearization component when said pulse code modulated digital input does not exceed said specified frequency.

4. The apparatus according to claim 3 wherein said frequency detector implements frequency detection by:
initializing a digital frequency variable to zero;
initializing a zero counter variable to zero;
determining if a previous input sample value was positive or negative;
if said previous input sample value was negative then determining whether the digital frequency variable is above a defined limit, wherein the limit determines a length of time during which an input must be above a frequency limit before said linearization component is bypassed;
if said previous input sample value was negative and said digital frequency variable is above said defined limit then causing said linearization component to be bypassed;
if said previous input sample value was positive then incrementing said zero counter variable;
determining whether a current input sample value is positive or negative;
if said current input sample value is positive then determining whether said digital frequency variable is above said defined limit;
if said current input sample value is positive and said digital frequency variable is above said defined limit then causing said linearization component to be bypassed;
if said current input sample value is not positive then determining whether said zero counter variable is less than three;
if said zero counter variable is not less than a selected limit then resetting said zero counter variable to zero, and resetting said digital frequency variable to zero, then determining whether said digital frequency variable is above said defined limit;
if said digital frequency variable is above said defined limit then causing said linearization component to be bypassed;
if said zero counter variable is less than said selected limit then incrementing said digital frequency variable, and resetting said zero counter variable to zero, then determining whether said digital frequency variable is above said defined limit;
if said digital frequency variable is above said defined limit then causing said linearization component to be bypassed.

5. The apparatus according to claim 4 wherein said pulse width modulated digital system is a ternary digital switching amplifier capable of providing compensated ternary output by processing an input signal along with a compensating pulse waveform.

6. The apparatus according to claim 1 wherein said pulse width modulated digital system is a binary pulse width modulated digital system and wherein said linearization component, implements linearization to interpolate data by:
adding an offset constant to a previous input sample value to obtain an offset previous input sample value wherein said offset constant has a value selected to render all offset previous input sample values greater than or equal to zero;
subtracting said previous input sample value from a current input sample value to obtain a fractional slope value, wherein said fractional slope value is proportional to a unity slope and wherein said unity slope equals a full scale digital signal change per sample;
multiplying said fractional slope value by said offset previous input sample value to obtain a first partial result;
adding said offset previous input sample value to said first partial result to obtain a first cross point estimate;
multiplying said fractional slope value by said first cross point estimate to obtain a second partial result;
adding said offset previous input sample value to said second partial result to obtain a second cross point estimate;
multiplying said fractional slope value by said second cross point estimate to obtain a third partial result;
adding said offset previous input sample value to said third partial result to obtain a third cross point estimate;

providing said third cross point estimate as an output from said linearization component.

7. The apparatus according to claim 6 wherein a frequency detector implements frequency detection by
initializing a digital frequency variable to zero;
initializing a zero counter variable to zero;
determining if said previous input sample value was positive or negative;
   if said previous input sample value was negative then determining whether the digital frequency variable is above a defined limit, wherein the limit determines a length of time during which an input must be above a frequency limit before said linearization component is bypassed;
      if said previous input sample value was negative and said digital frequency variable is above said defined limit then causing said linearization component to be bypassed;
   if said previous input sample value was positive then incrementing said zero counter variable;
determining whether said current input sample value is positive or negative;
   if said current input sample value is positive then determining whether said digital frequency variable is above said defined limit;
      if said current input sampler value is positive and said digital frequency variable is above said defined limit then causing said linearization component to be bypassed;
   if said current input sample value is not positive then determining whether said zero counter variable is less than three;
      if said zero counter variable is not less than a selected limit then resetting said zero counter variable to zero, and resetting said digital frequency variable to zero, then determining whether said digital frequency variable is above said defined limit;
         if said digital frequency variable is above said defined limit then causing said linearization component to be bypassed;
      if said zero counter variable is less than said selected limit then incrementing said digital frequency variable, and resetting said zero counter variable to zero, then determining whether said digital frequency variable is above said defined limit;
         if said digital frequency variable is above said defined limit then causing said linearization component to be bypassed.

8. The apparatus according to claim 1 wherein said pulse width modulated digital system is a ternary pulse width modulated digital system, and
   wherein said linearization component implements linearization of data by:
      subtracting a previous input sample value from a current input sample value to obtain a fractional slope value, wherein said fractional slope value is proportional to a unity slope wherein said unity slope equals a full scale digital signal change per sample;
      multiplying said fractional slope value by said previous input sample value to obtain a first partial result;
      adding said previous input sample value to said first partial result to obtain a first cross point estimate if said previous input sample value is positive, or subtracting said first partial result from said previous input sample value to obtain a first cross point estimate if said previous input sample value is negative;
      iteratively performing the following steps for n wherein n is a positive integer greater than or equal to 1;
         incrementing n;
         multiplying said fractional slope value by an n−1 th cross point estimate to obtain an nth partial result;
         adding said previous input sample value to said nth partial result to obtain an nth cross point estimate if said previous input sample value is positive, or subtracting said nth partial result from said previous input sample value to obtain an nth cross point estimate if said previous input sample value is negative; and
      providing said nth cross point estimate as an output from said linearization component.

9. The apparatus according to claim 8 wherein a frequency detector implements frequency detection by
initializing a digital frequency variable to zero;
initializing a zero counter variable to zero;
determining if said previous input sample value was positive or negative;
   if said previous input sample value was negative then determining whether the digital frequency variable is above a defined limit, wherein the limit determines a length of time during which an input must be above a frequency limit before said linearization component is bypassed;
      if said previous input sample value was negative and said digital frequency variable is above said defined limit then causing said linearization component to be bypassed;
   if said previous input sample value was positive then incrementing said zero counter variable;
determining whether said current input sample value is positive or negative;
   if said current input sample value is positive then determining whether said digital frequency variable is above said defined limit;
      if said current input sample value is positive and said digital frequency variable is above said defined limit then causing said linearization component to be bypassed;
   if said current input sample value is not positive then determining whether said zero counter variable is less than three;
      if said zero counter variable is not less than a selected limit then resetting said zero counter variable to zero, and resetting said digital frequency variable to zero, then determining whether said digital frequency variable is above said defined limit;
         if said digital frequency variable is above said defined limit then causing said linearization component to be bypassed;
      if said zero counter variable is less than said selected limit then incrementing said digital frequency variable, and resetting said zero counter variable to zero, then determining whether said digital frequency variable is above said defined limit;
         if said digital frequency variable is above said defined limit then causing said linearization component to be bypassed.

10. The apparatus according to claim 1 wherein said pulse width modulated digital system is a binary pulse width modulated digital system and wherein said linearization component implements linearization by:
   adding an offset constant to a previous input sample value to obtain an offset previous input sample value wherein said offset constant has a value selected to render all offset previous input sample values greater than or equal to zero;

subtracting said previous input sample value from a current input sample value to obtain a fractional slope value, wherein said fractional slope value is proportional to a unity slope wherein said unity slope equals a full scale digital signal change per sample;

multiplying said fractional slope value by said offset previous input sample value to obtain a first partial result;

adding said offset previous input sample value to said first partial result to obtain a first cross point estimate;

iteratively performing the following steps for n wherein n is a positive integer greater than or equal to 1;
incrementing n;
multiplying said fractional slope value by an n−1 th cross point estimate to obtain an nth partial result;
adding said previous input sample value to said nth partial result to obtain an nth cross point estimate if said previous input sample value is positive, or subtracting said nth partial result from said previous input sample value to obtain an nth cross point estimate if said previous input sample value is negative; and providing said nth cross point estimate as an output from said linearization component.

11. The apparatus according to claim 10 wherein a frequency detector implements frequency detection by:
initializing a digital frequency variable to zero;
initializing a zero counter variable to zero;
determining if said previous input sample value was positive or negative;
if said previous input sample value was negative then determining whether the digital frequency variable is above a defined limit, wherein the limit determines a length of time during which an input must be above a frequency limit before said linearization component is bypassed;
if said previous input sample value was negative and said digital frequency variable is above said defined limit then causing said linearization component to be bypassed;
if said previous input sample value was positive then incrementing said zero counter variable;
determining whether said current input sample value is positive or negative;
if said current input sample value is positive then determining whether said digital frequency variable is above said defined limit;
if said current input sample value is positive and said digital frequency variable is above said defined limit then causing said linearization component to be bypassed;
if said current input sample value is not positive then determining whether said zero counter variable is less than three;
if said zero counter variable is not less than a selected limit then resetting said zero counter variable to zero, and resetting said digital frequency variable to zero, then determining whether said digital frequency variable is above said defined limit;
if said digital frequency variable is above said defined limit then causing said linearization component to be bypassed;
if said zero counter variable is less than said selected limit then incrementing said digital frequency variable, and resetting said zero counter variable to zero, then determining whether said digital frequency variable is above said defined limit;
if said digital frequency variable is above said defined limit then causing said linearization component to be bypassed.

12. A method of reducing harmonic distortion in a pulse width modulated digital system comprising:
providing an interpolation filter having a pulse code modulated digital input;
providing a linearization block in switchable communication with said interpolation filter wherein an output signal of said interpolation filter is switchable to either be input for said linearization block or bypass said linearization block;
providing a noise shaper in switchable communication with said linearization wherein an output of said linearization is input to said noise shaper or where said linearization is bypassed and said output from said interpolation filter is input to said noise shaper, and wherein said noise shaper provides parameters for constructing a pulse width modulated output signal;
providing a frequency detection block having an input in communication with said input of said interpolation filter wherein said pulse code modulated digital input to said interpolation filter is also provided to said input of said frequency detection block, wherein said frequency detection block is capable of causing said output of said interpolation filter to bypass said linearization block when said pulse code modulated digital input exceeds a specified frequency or alternatively to direct said output of said interpolation filter to said linearization block when said pulse code modulated digital input does not exceed said specified frequency.

13. The method according to claim 12 wherein said pulse width modulated digital system is a ternary pulse width modulated digital system, and
wherein said linearization block, when not bypassed, implements a linearization algorithm to interpolate data, comprising the steps of:
subtracting a previous input sample value from a current input sample value to obtain a fractional slope value, wherein said fractional slope value is proportional to a unity slope wherein said unity slope equals a full scale digital signal change per sample;
multiplying said fractional slope value by said previous input sample value to obtain a first partial result;
adding said previous input sample value to said first partial result to obtain a first cross point estimate if said previous input sample value is positive, or subtracting said first partial result from said previous input sample value to obtain a first cross point estimate if said previous input sample value is negative;
multiplying said fractional slope value by said first cross point estimate to obtain a second partial result;
adding said previous input sample value to said second partial result to obtain a second cross point estimate if said previous input sample value is positive, or subtracting said second partial result from said previous input sample value to obtain a second cross point estimate if said previous input sample value is negative;
multiplying said fractional slope value by said second cross point estimate to obtain a third partial result;
adding said previous input sample value to said third partial result to obtain a third cross point estimate if said previous input sample value is positive, or subtracting said third partial result from said previous input sample value to obtain a third cross point estimate if said previous input sample value is negative;

providing said third cross point estimate as an output from said linearization block.

14. The method according to claim 13 wherein said frequency detection block implements a frequency detection algorithm once per input sample, comprising the steps of:

initializing a digital frequency variable to zero;

initializing a zero counter variable to zero;

determining if said previous input sample value was positive or negative;
  if said previous input sample value was negative then determining whether the digital frequency variable is above a defined limit, wherein the limit determines a length of time during which an input must be above a frequency limit before said linearization block is disabled;
    if said previous input sample value was negative and said digital frequency variable is above said defined limit then causing said linearization block to be bypassed;
  if said previous input sample value was positive then incrementing said zero counter variable;

determining whether said current input sample value is positive or negative;
  if said current input sample value is positive then determining whether said digital frequency variable is above said defined limit;
    if said current input sample value is positive and said digital frequency variable is above said defined limit then causing said linearization block to be bypassed;
  if said current input sample value is not positive then determining whether said zero counter variable is less than three;
    if said zero counter variable is not less than a selected limit then resetting said zero counter variable to zero, and resetting said digital frequency variable to zero, then determining whether said digital frequency variable is above said defined limit;
      if said digital frequency variable is above said defined limit then causing said linearization block to be bypassed;
    if said zero counter variable is less than said selected limit then incrementing said digital frequency variable, and resetting said zero counter variable to zero, then determining whether said digital frequency variable is above said defined limit;
      if said digital frequency variable is above said defined limit then causing said linearization block to be bypassed.

15. The method according to claim 14 wherein said pulse width modulate digital system is a ternary digital switching amplifier capable of providing compensated ternary output by processing an input signal along with a compensating pulse waveform.

16. The method according to claim 12 wherein said pulse width modulated digital system is a binary pulse width modulated digital system and wherein said linearization block, when not bypassed, implements a linearization algorithm to interpolate data, comprising the steps of:

adding an offset constant to a previous input sample value to obtain an offset previous input sample value wherein said offset constant has a value sufficiently large to render all offset previous input sample values greater than or equal to zero;

subtracting said previous input sample value from a current input sample value to obtain a fractional slope value, wherein said fractional slope value is proportional to a unity slope wherein said unity slope equals a full scale digital signal change per sample;

multiplying said fractional slope value by said offset previous input sample value to obtain a first partial result;

adding said offset previous input sample value to said first partial result to obtain a first cross point estimate;

multiplying said fractional slope value by said first cross point estimate to obtain a second partial result;

adding said offset previous input sample value to said second partial result to obtain a second cross point estimate;

multiplying said fractional slope value by said second cross point estimate to obtain a third partial result;

adding said offset previous input sample value to said third partial result to obtain a third cross point estimate;

providing said third cross point estimate as an output from said linearization block.

17. The method according to claim 16 wherein said frequency detection block implements a frequency detection algorithm once per input sample, comprising the steps of:

initializing a digital frequency variable to zero;

initializing a zero counter variable to zero;

determining if said previous input sample value was positive or negative;
  if said previous input sample value was negative then determining whether the digital frequency variable is above a defined limit, wherein the limit determines a length of time during which an input must be above a frequency limit before said linearization block is disabled;
    if said previous input sample value was negative and said digital frequency variable is above said defined limit then causing said linearization block to be bypassed;
  if said previous input sample value was positive then incrementing said zero counter variable;

determining whether said current input sample value is positive or negative;
  if said current input sample value is positive then determining whether said digital frequency variable is above said defined limit;
    if said current input sample value is positive and said digital frequency variable is above said defined limit then causing said linearization block to be bypassed;
  if said current input sample value is not positive then determining whether said zero counter variable is less than three;
    if said zero counter variable is not less than a selected limit then resetting said zero counter variable to zero, and resetting said digital frequency variable to zero, then determining whether said digital frequency variable is above said defined limit;
      if said digital frequency variable is above said defined limit then causing said linearization block to be bypassed;
    if said zero counter variable is less than said selected limit then incrementing said digital frequency variable, and resetting said zero counter variable to zero, then determining whether said digital frequency variable is above said defined limit;
   if said digital frequency variable is above said defined limit then causing said linearization block to be bypassed.

18. The method according to claim 12 wherein said pulse width modulated digital system is a ternary pulse width modulated digital system, and
wherein said linearization block, when not bypassed, implements a linearization algorithm to interpolate data, comprising the steps of:
subtracting a previous input sample value from a current input sample value to obtain a fractional slope value, wherein said fractional slope value is proportional to a unity slope wherein said unity slope equals a full scale digital signal change per sample;
multiplying said fractional slope value by said previous input sample value to obtain a first partial result;
adding said previous input sample value to said first partial result to obtain a first cross point estimate if said previous input sample value is positive, or subtracting said first partial result from said previous input sample value to obtain a first cross point estimate if said previous input sample value is negative;
iteratively performing the following steps for n wherein n is a positive integer greater than or equal to 1;
  incrementing n;
  multiplying said fractional slope value by an n−1 th cross point estimate to obtain an nth partial result;
  adding said previous input sample value to said nth partial result to obtain an nth cross point estimate if said previous input sample value is positive, or subtracting said nth partial result from said previous input sample value to obtain an nth cross point estimate if said previous input sample value is negative; and
providing said nth cross point estimate as an output from said linearization block.

19. The method according to claim 18 wherein said frequency detection block implements a frequency detection algorithm, comprising the steps of:
initializing a digital frequency variable to zero;
initializing a zero counter variable to zero;
determining if said previous input sample value was positive or negative;
  if said previous input sample value was negative then determining whether the digital frequency variable is above a defined limit, wherein the limit determines a length of time during which an input must be above a frequency limit before said linearization block is disabled;
    if said previous input sample value was negative and said digital frequency variable is above said defined limit then causing said linearization block to be bypassed;
  if said previous input sample value was positive then incrementing said zero counter variable;
determining whether said current input sample value is positive or negative;
  if said current input sample value is positive then determining whether said digital frequency variable is above said defined limit;
    if said current input sample value is positive and said digital frequency variable is above said defined limit then causing said linearization block to be bypassed;
  if said current input sample value is not positive then determining whether said zero counter variable is less than three;
    if said zero counter variable is not less than a selected limit then resetting said zero counter variable to zero, and resetting said digital frequency variable to zero, then determining whether said digital frequency variable is above said defined limit;
      if said digital frequency variable is above said defined limit then causing said linearization block to be bypassed;
    if said zero counter variable is less than said selected limit then incrementing said digital frequency variable, and resetting said zero counter variable to zero, then determining whether said digital frequency variable is above said defined limit;
      if said digital frequency variable is above said defined limit then causing said linearization block to be bypassed.

20. The method according to claim 12 wherein said pulse width modulated digital system is a binary pulse width modulated digital system and wherein said linearization block, when not bypassed, implements a linearization algorithm to interpolate data, comprising the steps of:
adding an offset constant to a previous input sample value to obtain an offset previous input sample value wherein said offset constant has a value sufficiently large to render all offset previous input sample values greater than or equal to zero;
subtracting said previous input sample value from a current input sample value to obtain a fractional slope value, wherein said fractional slope value is proportional to a unity slope wherein said unity slope equals a full scale digital signal change per sample;
multiplying said fractional slope value by said offset previous input sample value to obtain a first partial result;
adding said offset previous input sample value to said first partial result to obtain a first cross point estimate;
iteratively repeating multiplication and addition steps for n iterations to determine an nth cross point estimate, wherein n equals any positive integer;
providing said nth cross point estimate as an output from said linearization block.

21. The method according to claim 20 wherein said frequency detection block implements a frequency detection algorithm comprising the steps of:
initializing a digital frequency variable to zero;
initializing a zero counter variable to zero;
determining if said previous input sample value was positive or negative;
  if said previous input sample value was negative then determining whether the digital frequency variable is above a defined limit, wherein the limit determines a length of time during which an input must be above a frequency limit before said linearization block is disabled;
    if said previous input sample value was negative and said digital frequency variable is above said defined limit then causing said linearization block to be bypassed;
  if said previous input sample value was positive then incrementing said zero counter variable;
determining whether said current input sample value is positive or negative;

if said current input sampler value is positive then determining whether said digital frequency variable is above said defined limit;

if said current input sample value is positive and said digital frequency variable is above said defined limit then causing said linearization block to be bypassed;

if said current input sample value is not positive then determining whether said zero counter variable is less than three;

if said zero counter variable is not less than a selected limit then resetting said zero counter variable to zero, and resetting said digital frequency variable to zero, then determining whether said digital frequency variable is above said defined limit;

if said digital frequency variable is above said defined limit then causing said linearization block to be bypassed;

if said zero counter variable is less than said selected limit then incrementing said digital frequency variable, and resetting said zero counter variable to zero, then determining whether said digital frequency variable is above said defined limit;

if said digital frequency variable is above said defined limit then causing said linearization block to be bypassed.

22. An apparatus for reducing harmonic distortion in a pulse width modulated digital system comprising:

means for interpolation filtering having a pulse code modulated digital input;

means for linearizing a signal, in switchable communication with said means for interpolation filtering, wherein an output signal of said means for interpolation filtering is switchable to either be input to said means for linearizing said signal or bypass said means for linearizing said signal; and means for noise shaping in switchable communication with said means for linearizing said signal wherein an output of said means for linearizing said signal is input to said means for noise shaping, or when said means for linearizing said signal is bypassed said output from said means for interpolation filtering is input to said means for noise shaping and said means for noise shaping providing parameters for constructing a pulse width modulated output signal.

23. A method of reducing harmonic distortion in a pulse width modulated digital system comprising:

providing an interpolation filter having a pulse code modulated digital input;

providing linearization in switchable communication with said interpolation filter wherein an output signal of said interpolation filter is switchable to either be input for said linearization or bypass said linearization; and providing a noise shaper in switchable communication with said linearization wherein an output of said linearization is input to said noise shaper or where said linearization is bypassed and said output from said interpolation filter is input to said noise shaper, and wherein said noise shaper provides parameters for constructing a pulse width modulated output signal.

\* \* \* \* \*